United States Patent
Ouellet et al.

(10) Patent No.: US 6,825,127 B2
(45) Date of Patent: Nov. 30, 2004

(54) MICRO-FLUIDIC DEVICES

(75) Inventors: Luc Ouellet, Granby (CA); Heather Tyler, Bromont (CA)

(73) Assignee: Zarlink Semiconductor Inc., Kanata (CA)

(*) Notice: Subject to any disclaimer, the term of this patent is extended or adjusted under 35 U.S.C. 154(b) by 283 days.

(21) Appl. No.: 09/910,795

(22) Filed: Jul. 24, 2001

(65) Prior Publication Data

US 2003/0022505 A1 Jan. 30, 2003

(51) Int. Cl.[7] .............................................. H01L 21/302
(52) U.S. Cl. ...................... 438/745; 438/422; 438/700; 438/706; 438/750; 216/17
(58) Field of Search ................................. 438/422, 319, 438/700, 706, 745, 750, 424; 216/2, 11, 17

(56) References Cited

U.S. PATENT DOCUMENTS

| | | | |
|---|---|---|---|
| 5,376,252 A | 12/1994 | Ekstrom et al. ............. 204/299 |
| 5,510,645 A | * 4/1996 | Fitch et al. .................. 257/522 |
| 5,591,139 A | 1/1997 | Lin et al. ..................... 604/264 |
| 5,698,112 A | 12/1997 | Naeher et al. |
| 5,699,157 A | 12/1997 | Parce .......................... 356/344 |
| 5,705,018 A | 1/1998 | Hartley ........................ 156/345 |
| 5,716,852 A | 2/1998 | Yager et al. ................. 436/172 |
| 5,755,942 A | 5/1998 | Zanzucchi et al. .......... 204/454 |
| 5,779,868 A | 7/1998 | Parce et al. .................. 204/604 |
| 5,800,690 A | 9/1998 | Chow et al. ................. 204/451 |
| 5,842,787 A | 12/1998 | Kopf-Sill et al. ............ 366/340 |
| 5,849,208 A | 12/1998 | Hayes et al. .................. 216/94 |
| 5,852,495 A | 12/1998 | Parce .......................... 356/344 |
| 5,855,801 A | 1/1999 | Lin et al. ........................ 216/2 |
| 5,856,174 A | 1/1999 | Lipshutz et al. .......... 435/286.5 |
| 5,863,502 A | 1/1999 | Southgate et al. ............ 422/58 |
| 5,869,004 A | 2/1999 | Parce et al. .................. 422/100 |
| 5,876,675 A | 3/1999 | Kennedy ....................... 422/99 |
| 5,880,071 A | 3/1999 | Parce et al. .................. 204/453 |
| 5,882,465 A | 3/1999 | McReynolds ................ 156/285 |
| 5,885,470 A | 3/1999 | Parce et al. .................... 216/33 |
| 5,902,165 A | * 5/1999 | Levine et al. .................. 445/24 |
| 5,922,210 A | 7/1999 | Brody et al. ................. 210/767 |
| 5,922,604 A | 7/1999 | Stapleton et al. .............. 436/46 |
| 5,932,100 A | 8/1999 | Yager et al. ................. 210/634 |
| 5,932,315 A | 8/1999 | Lum et al. ................... 428/172 |
| 5,942,443 A | 8/1999 | Parce et al. .................. 436/514 |
| 5,948,227 A | 9/1999 | Dubrow ....................... 204/455 |
| 5,948,684 A | 9/1999 | Weigl et al. ................... 436/52 |
| 5,955,028 A | 9/1999 | Chow ............................ 422/63 |
| 5,957,579 A | 9/1999 | Kopf-Sill et al. ........... 366/340 |
| 5,958,203 A | 9/1999 | Parce et al. .................. 204/451 |
| 5,958,694 A | 9/1999 | Nikiforov ....................... 435/6 |

(List continued on next page.)

FOREIGN PATENT DOCUMENTS

| | | |
|---|---|---|
| SE | 513 072 C2 | 7/2000 |
| WO | WO 95/16192 | 6/1995 |
| WO | WO 00/12428 | 3/2000 |

OTHER PUBLICATIONS

Elderstig, Hakan et al., "Spin deposition of polymers over holes and cavities", Sensors and Actuators, 1995, pp. 95–97.

*Primary Examiner*—Lan Vinh
(74) *Attorney, Agent, or Firm*—Marks & Clerk

(57) ABSTRACT

In a method of fabricating a microstructure for micro-fluidics applications, a mechanically stable support layer is formed over a layer of etchable material. An anisotropic etch is preformed through a mask to form a pattern of holes extending through the support layer into said etchable material. An isotropic etch is performed through each said hole to form a corresponding cavity in the etchable material under each hole and extending under the support layer. A further layer of depositable material is formed over the support layer until portions of the depositable layer overhanging each said hole meet and thereby close the cavity formed under each hole. The invention permits the formation of micro-channels and filters of varying configuration.

29 Claims, 8 Drawing Sheets

U.S. PATENT DOCUMENTS

| | | | |
|---|---|---|---|
| 5,964,995 A | 10/1999 | Nikiforov et al. | 204/450 |
| 5,965,001 A | 10/1999 | Chow et al. | 204/600 |
| 5,965,410 A | 10/1999 | Chow et al. | 435/91.2 |
| 5,972,187 A | 10/1999 | Parce et al. | 204/453 |
| 5,972,710 A | 10/1999 | Weigl et al. | 436/34 |
| 5,980,719 A | 11/1999 | Cherukuri et al. | 204/600 |
| 5,989,402 A | 11/1999 | Chow et al. | 204/601 |
| 5,992,820 A | 11/1999 | Fare et al. | 251/129.01 |
| 6,004,515 A | 12/1999 | Parce et al. | 422/100 |
| 6,004,832 A * | 12/1999 | Haller et al. | 438/50 |
| 6,007,775 A | 12/1999 | Yager | 422/57 |
| 6,011,252 A | 1/2000 | Jensen | 250/214 R |
| 6,012,902 A | 1/2000 | Parce | 417/48 |
| 6,042,709 A | 3/2000 | Parce et al. | 204/453 |
| 6,042,710 A | 3/2000 | Dubrow | 204/454 |
| 6,043,080 A | 3/2000 | Lipshutz et al. | 435/287.2 |
| 6,046,056 A | 4/2000 | Parce et al. | 436/514 |
| 6,048,498 A | 4/2000 | Kennedy | 422/99 |
| 6,048,734 A | 4/2000 | Burns et al. | 436/180 |
| 6,054,277 A | 4/2000 | Furcht et al. | 435/6 |
| 6,056,269 A | 5/2000 | Johnson et al. | 251/331 |
| 6,057,149 A | 5/2000 | Burns et al. | 435/287.2 |
| 6,062,261 A | 5/2000 | Jacobson et al. | 137/827 |
| 6,063,589 A | 5/2000 | Kellogg et al. | 435/24 |
| 6,068,752 A | 5/2000 | Dubrow et al. | 204/604 |
| 6,071,478 A | 6/2000 | Chow | 422/81 |
| 6,073,482 A | 6/2000 | Moles | 73/53.01 |
| 6,074,725 A | 6/2000 | Kennedy | 428/188 |
| 6,074,827 A | 6/2000 | Nelson et al. | 435/6 |
| 6,078,340 A | 6/2000 | Jeanmaire et al. | 346/140.1 |
| 6,080,295 A | 6/2000 | Parce et al. | 204/451 |
| 6,082,140 A | 7/2000 | Ackler et al. | 65/36 |
| 6,086,740 A | 7/2000 | Kennedy | 204/601 |
| 6,086,825 A | 7/2000 | Sundberg et al. | 422/100 |
| 6,090,251 A | 7/2000 | Sundberg et al. | 204/453 |
| 6,091,502 A | 7/2000 | Weigl et al. | 356/416 |
| 6,096,656 A | 8/2000 | Matzke et al. | 438/702 |
| 6,100,541 A | 8/2000 | Nagle et al. | 250/573 |
| 6,103,199 A | 8/2000 | Bjornson et al. | 422/100 |
| 6,106,685 A | 8/2000 | McBride et al. | 204/600 |
| 6,107,044 A | 8/2000 | Nikiforov et al. | 435/6 |
| 6,118,126 A | 9/2000 | Zanzucchi | 250/458.1 |
| 6,120,666 A | 9/2000 | Jacobson et al. | 204/452 |
| 6,123,798 A | 9/2000 | Grandhi et al. | 156/292 |
| 6,126,140 A | 10/2000 | Johnson et al. | 251/129.01 |
| 6,126,765 A | 10/2000 | Ohman | 156/74 |
| 6,129,826 A | 10/2000 | Nikiforov et al. | 204/450 |
| 6,129,854 A | 10/2000 | Ramsey et al. | 216/18 |
| 6,130,098 A | 10/2000 | Handique et al. | 436/180 |
| 6,131,410 A | 10/2000 | Swierkowski et al. | 65/36 |
| 6,132,685 A | 10/2000 | Kercso et al. | 422/104 |
| 6,136,212 A | 10/2000 | Mastrangelo et al. | 216/49 |
| 6,136,272 A | 10/2000 | Weigl et al. | 422/82.05 |
| 6,137,501 A | 10/2000 | Wen et al. | 346/140.1 |
| 6,143,152 A | 11/2000 | Simpson et al. | 204/451 |
| 6,143,248 A | 11/2000 | Kellogg et al. | 422/72 |
| 6,146,103 A | 11/2000 | Lee et al. | 417/50 |
| 6,148,508 A | 11/2000 | Wolk | 29/825 |
| 6,149,787 A | 11/2000 | Chow et al. | 204/451 |
| 6,149,870 A | 11/2000 | Parce et al. | 422/100 |
| 6,150,119 A | 11/2000 | Kopf-Sill et al. | 435/7.1 |
| 6,150,180 A | 11/2000 | Parce et al. | 436/514 |
| 6,153,073 A | 11/2000 | Dubrow et al. | 204/453 |
| 6,154,226 A | 11/2000 | York et al. | 346/140.1 |
| 6,156,181 A | 12/2000 | Parce et al. | 204/600 |
| 6,159,739 A | 12/2000 | Weigl et al. | 436/52 |
| 6,167,910 B1 | 1/2001 | Chow | 137/827 |
| 6,170,981 B1 | 1/2001 | Regnier et al. | 366/336 |
| 6,171,067 B1 | 1/2001 | Parce | 417/48 |
| 6,171,850 B1 | 1/2001 | Nagle et al. | 435/286.1 |
| 6,171,865 B1 | 1/2001 | Weigl et al. | 436/52 |
| 6,172,353 B1 | 1/2001 | Jensen | 250/214 R |
| 6,174,675 B1 | 1/2001 | Chow et al. | 435/6 |
| 6,174,820 B1 * | 1/2001 | Habermehl et al. | 438/745 |
| 6,180,536 B1 | 1/2001 | Chong et al. | |
| 6,186,660 B1 | 2/2001 | Kopf-Sill et al. | 366/340 |
| 6,602,791 B2 * | 8/2003 | Ouellet et al. | 438/696 |

* cited by examiner

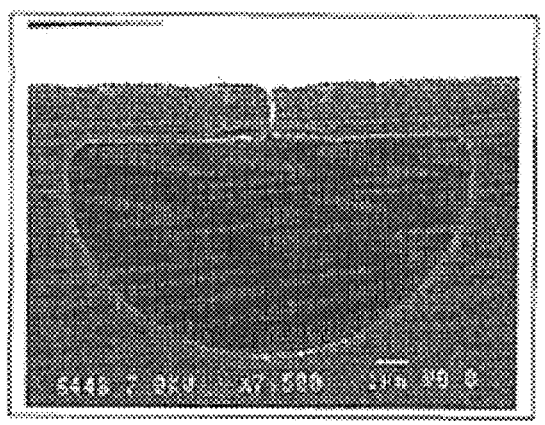
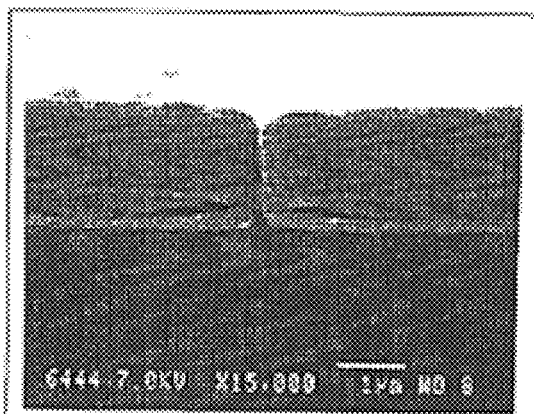
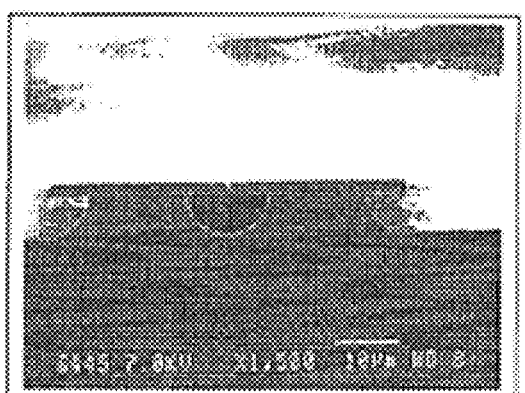
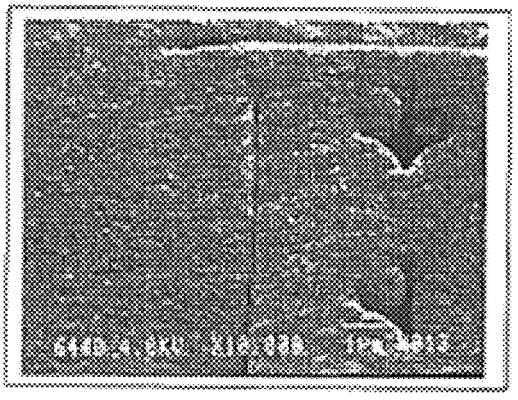
FIG. 9
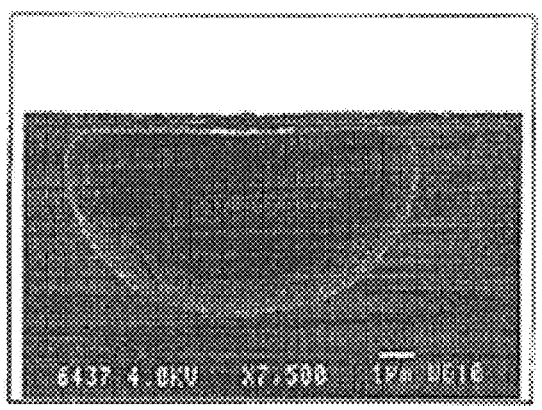
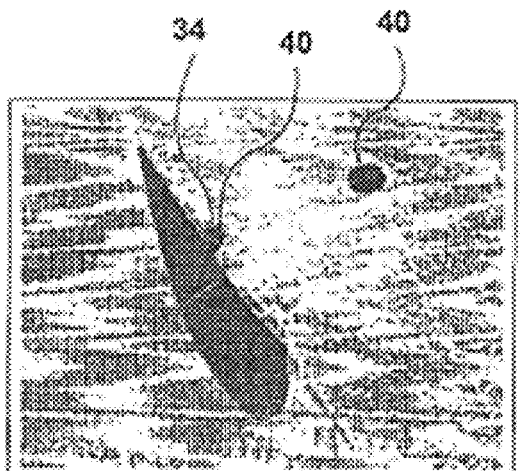
FIG. 10
FIG. 11

MICRO-FLUIDIC DEVICES

BACKGROUND OF THE INVENTION

1. Field of the Invention

This invention relates to the fabrication of microstructures, and more particularly to a method of making an active micro-fluidic device from a micro-machined substrate.

2. Description of Related Art

Micro-fluidic devices are used in many applications. They come in two varieties: active and passive. Typical examples of active devices would be micro-detection/analysis/reactor systems; micro-chemical detection/analysis/reactor systems; micro-opto-fluidics systems; micro-fluid delivery systems; micro-fluid interconnect systems; micro-fluid transport systems; micro-fluid mixing systems; micro-valves/pumps systems; micro flow/pressure systems; micro-fluid control systems; micro-heating/cooling systems; micro-fluidic packaging; micro-inkjet printing; biochips; and laboratory-on-a-chip, LOAC, devices. Typical examples of passive (i.e. off-chip electronics) micro-channels, would be micro-chemical detection/analysis systems; micro-detection/analysis systems; micro-chemical detection/analysis systems; micro-opto-fluidics systems; micro-fluid delivery systems; micro-fluid interconnect systems; micro-fluid transport systems; micro-fluid mixing systems; micro-valves/pumps systems; micro flow/pressure systems; micro-fluid control systems; micro-heating/cooling systems. micro-fluidic packaging; micro-inkjet printing; biochips; and LOAC devices.

The prior art shows that passive micro-fluidics devices with micro-channels are largely fabricated from the combination of various polymer substrates, such as: acrylonitrile-butadiene-styrene copolymer, polycarbonate, polydimethylsiloxane (PDMS), polyethylene, polymethylmethacrylate (PMMA), polymethylpentene, polypropylene, polystyrene, polysulfone, polytetrafluoroethylene (PTFE), polyurethane, polyvinylchloride (PVC), polyvinylidine fluoride (PVF), or other polymer. In this case, lithography or mechanical stamping is used to define a network of micro-fluidics channels in one of these substrate, prior to the assembly and the thermally assisted bonding of this first substrate to another such substrate. The result is a simple passive micro-fluidics device which can be patterned with conductive layers as to connect an external processor used to provoke fluid movement by electrophoresis or electro-osmosis, analysis and data generation. FIGS. 1a to 1c of U.S. Pat. No. 6,167,910 show an example of a passive micro-fluidics device obtained from the fusion of such polymeric substrates.

The prior art also indicates that passive micro-fluidics devices with micro-channels can be fabricated by combining various micro-machined silica or quartz substrates. Again, assembly and fusion bonding is required. The result is a simple passive micro-fluidics device which can be patterned with conductive layers as to connect an external processor used to provoke fluid movement by electrophoresis or electro-osmosis, analysis and data generation. FIGS. 1 of U.S. Pat. No. 6,131,410 shows an example of such passive micro-fluidics devices with micro-channels obtained from the fusion of such silica substrates.

The prior art indicates that passive micro-fluidics devices with micro-channels can be fabricated from a passive micro-machined silicon structural substrate. Again, assembly and fusion bonding of at least two sub-assemblies is required. The result is a simple passive micro-fluidics device to connect to an external processor used to provoke fluid movement, analysis and data generation. FIGS. 1 to 3 of U.S. Pat. No. 5,705,018 show an example of such passive micro-fluidics devices with micro-channels obtained from a passive micro-machined silicon substrate.

The prior art also discloses that active micro-fluidics devices (with no micro-channels) can be fabricated from an active micro-machined silicon substrate. In this case, the control electronics integrated in the silicon substrate is used as an active on-chip fluid processor and communication device. The result is a sophisticated device which can perform, in pre-defined reservoirs, without micro-channels, various fluidics, analysis and (remote) data communication functions without the need of an external fluid processor in charge of fluid movement, analysis and data generation. FIG. 3B of U.S. Pat. No. 6,117,643 shows an example of such active micro-fluidics devices (with no micro-channels) obtained from an active micro-machined silicon substrate.

SUMMARY OF THE INVENTION

This invention relates to an improved micro-machining technique which uses a maximum processing temperature of less than 500° C. to fabricate micro-fluidics elements and micro-channels over an active semiconductor device thus resulting in integrated active micro-fluidics devices with micro-channels. The manufacturing of micro-fluidic devices with micro-channels requires the fabrication of micro-fluidics elements and micro-channels for the processing of fluids.

Accordingly the present invention provides a method of fabricating a microstructure for micro-fluidics applications, comprising the steps of forming a layer of etchable material on a substrate; forming a mechanically stable support layer over said etchable material; performing an anisotropic etch through a mask to form a pattern of holes extending through said support layer into said etchable material, said holes being separated from each other by a predetermined distance; performing an isotropic etch through each said hole to form a corresponding cavity in said etchable material under each said hole and extending under said support layer; and forming a further layer of depositable material over said support layer until portions of said depositable layer overhanging each said hole meet and thereby close the cavity formed under each said hole.

The holes should generally be set a distance apart so that after the isotropic etch the cavities overlap to form the micro-channels. In one embodiment, they can be set further apart so as to form pillars between the cavities. This embodiment is useful for the fabrication of micro-filters.

The invention permits the fabrication of active micro-fluidics devices with micro-channels from an active micro-machined silicon substrate directly over a Complementary Metal Oxide Semiconductor device, CMOS device, or a high-voltage CMOS (or BCD) device.

CMOS devices are capable of very small detection levels, an important prerequisite in order to perform electronic capacitance detection (identification) of entities in suspension in the fluids with low signal levels. CMOS devices can perform the required data processing and (remote) communication functions. High-voltage CMOS (or Bipolar-CMOS-DMOS, BCD) devices with adequate operation voltages and operation currents are capable of performing the required micro-fluidics in the micro-channels and allowing the integration of a complete Laboratory-On-A-Chip concept.

This invention employs an improved micro-machining technique used to integrate to CMOS and high-voltage CMOS (or BCD) devices the micro-machining steps which allow the fabrication of the micro-fluidics elements and micro-channels at a maximum processing temperature not exceeding 500° C. without the use of a second substrate and without the use of thermal bonding. The maximum processing temperature of 500° C. prevents the degradation of the underlying CMOS and high-voltage CMOS (or BCD) devices; and prevents any mechanical problems such as plastic deformation, peeling, cracking, delamination and other such high temperature related problems with the thin layers used in the micro-machining of the micro-fluidics device.

The novel materials combination described is not typical of Micro-Electro-Mechanical-Systems (MEMS) which typically use Low Pressure Chemical Vapour Deposited polysilicon, LPCVD polysilicon, and Plasma Enhanced Chemical Vapour Deposited silica, PECVD $SiO_2$, combinations. The use of LPCVD polysilicon is proscribed because of its required deposition temperature of more then 550° C.

An innovative sacrificial material is Collimated Reactive Physical Vapour Deposition of Titanium Nitride, CRPVD TiN. This sacrificial CRPVD TiN material has excellent mechanical properties, excellent selectivity to Isotropic Wet Etching solutions used to define the micro-channels in thick layers of Plasma Enhanced Chemical Vapour Deposited, PECVD, $SiO_2$, and a deposition temperature of about 400° C.

BRIEF DESCRIPTION OF THE DRAWINGS

The invention will now be described in more detail, by way of example, only with reference to the accompanying drawings, in which:

FIG. 9 shows scanning electron micrograph, SEM, cross section views and top views demonstrating the closure of the micro-channels with PECVD SiO2;

FIG. 10 shows a scanning electron micrograph, SEM, cross-section view of a micro-channel achieved with the dotted-hole approach;

FIG. 11 shows a scanning electron micrograph, SEM, top view of a micro-channel achieved with the dotted-hole approach;

DETAILED DESCRIPTION OF THE PREFERRED EMBODIMENTS

The fabrication steps of micro-fluidics devices with micro-channels over existing CMOS and high-voltage CMOS (or BCD) devices is described into our patent co-pending U.S. patent application Ser. No. 09/842,536 filed Apr. 27, 2001.

Figure 1:
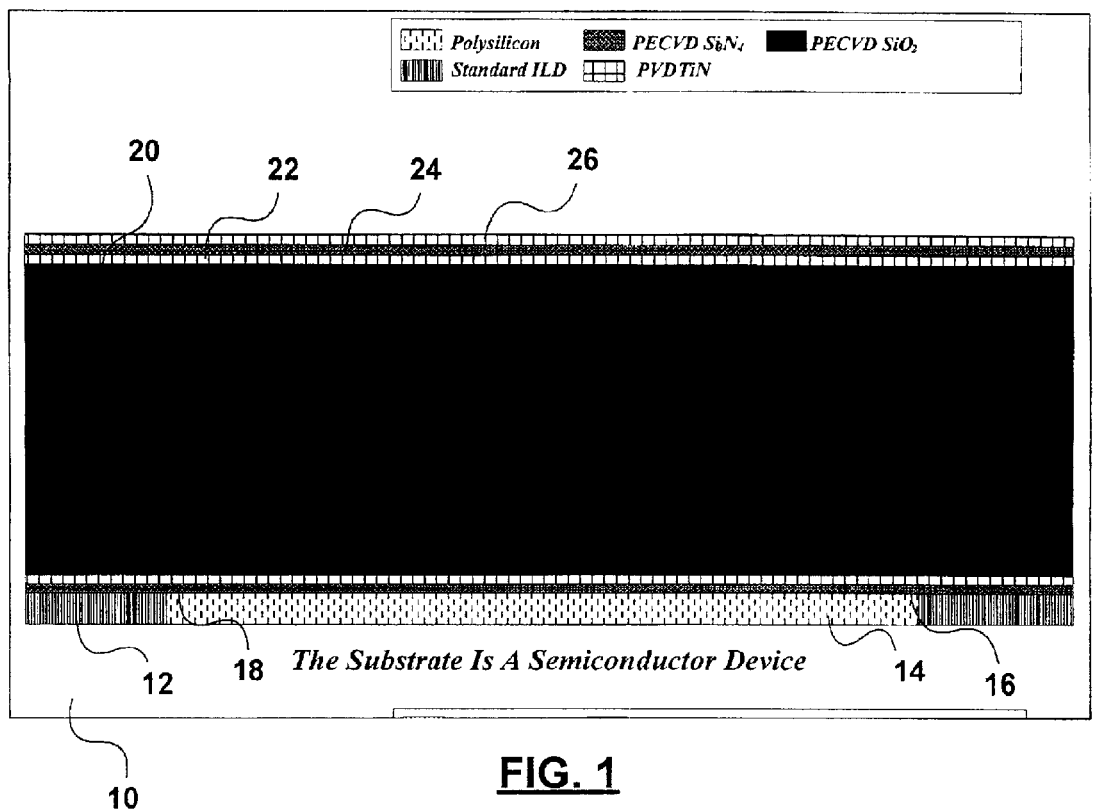
FIG. 1 illustrates an intermediate stage in the production of a micro-fluidic device up to and including step 6 of the micro-machining sequence.

In an initial preparatory step, step 0, a CMOS process is used to fabricate a semiconductor device 10 (FIG. 1) including interlayer dielectric isolation (ILD) 12 between the last LPCVD polysilicon level 14 and the first metal level or alternately between the first metal level and the second metal level. The isolation dielectric 12 is present before the beginning of the micro-machining steps to be described. An opening is made through this isolation dielectric 12 to reach the areas of the last LPCVD polysilicon layer or of the first metal level which will be used as an electrode connected to high-voltage CMOS devices for fluid movement.

In step 1 of the micromachining process, a layer 16 of PECVD $Si_3N_4$ about 0.10 µm thick is deposited at 400° C. In step 2, a layer 18 of CRPVD TiN about 0.10 µm is deposited at 400° C. In step 3, a layer 20 PECVD $SiO_2$ about 10.0 µm thick is deposited at 400° C.

Next, in step 4 a layer 22 of CRPVD TiN about 0.10 µm thick is deposited at 400° C. In step 5, a layer 24 of PECVD $Si_3N_4$ about 0.40 µm thick is deposited at 400° C. In step 6, a layer 26 of CRPVD TiN about 0.20 µm thick is deposited at 400° C.

Figure 2:
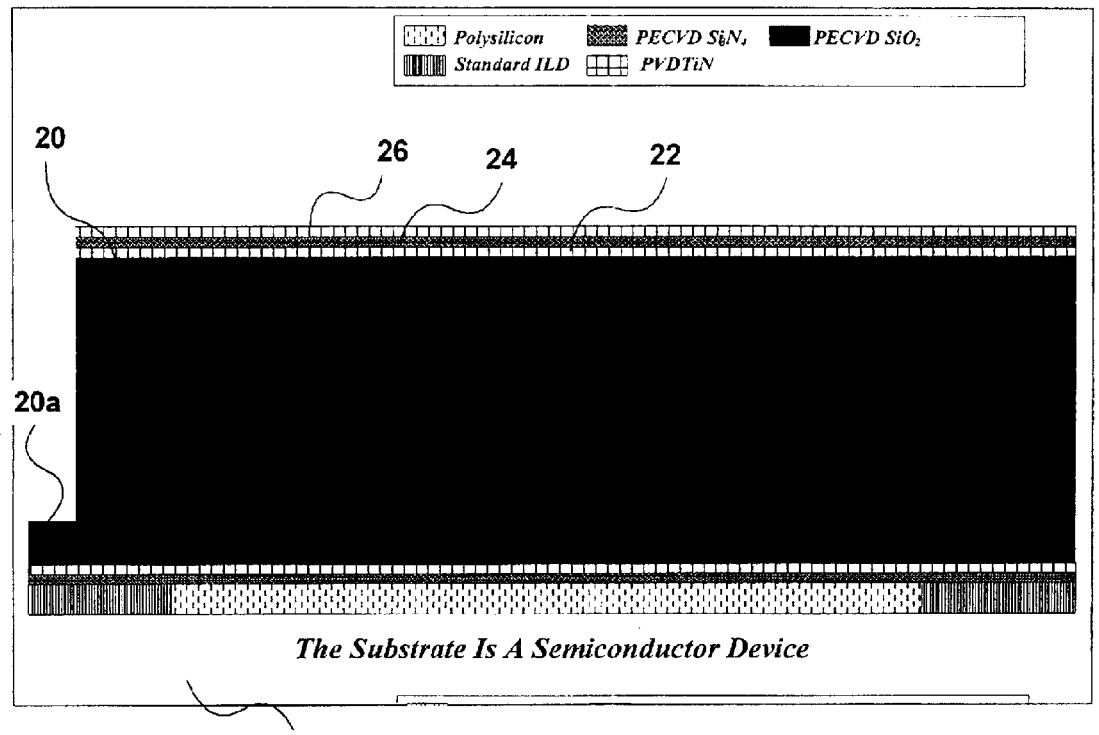
FIG. 2 illustrates step 7 of the micro-machining sequence.

In step 7, shown in FIG. 2, the first micro-machining mask is applied to define the MEMS region. This is followed by the Anisotropic Reactive Ion Etching, (Anisotropic RIE) of the CRPVD TiN/PECVD $Si_3N_4$/CRPVD TiN sandwich followed by the partial Anisotropic RIE of the PECVD $SiO_2$ layer 20, leaving a residual shoulder 20a.

Figure 3:
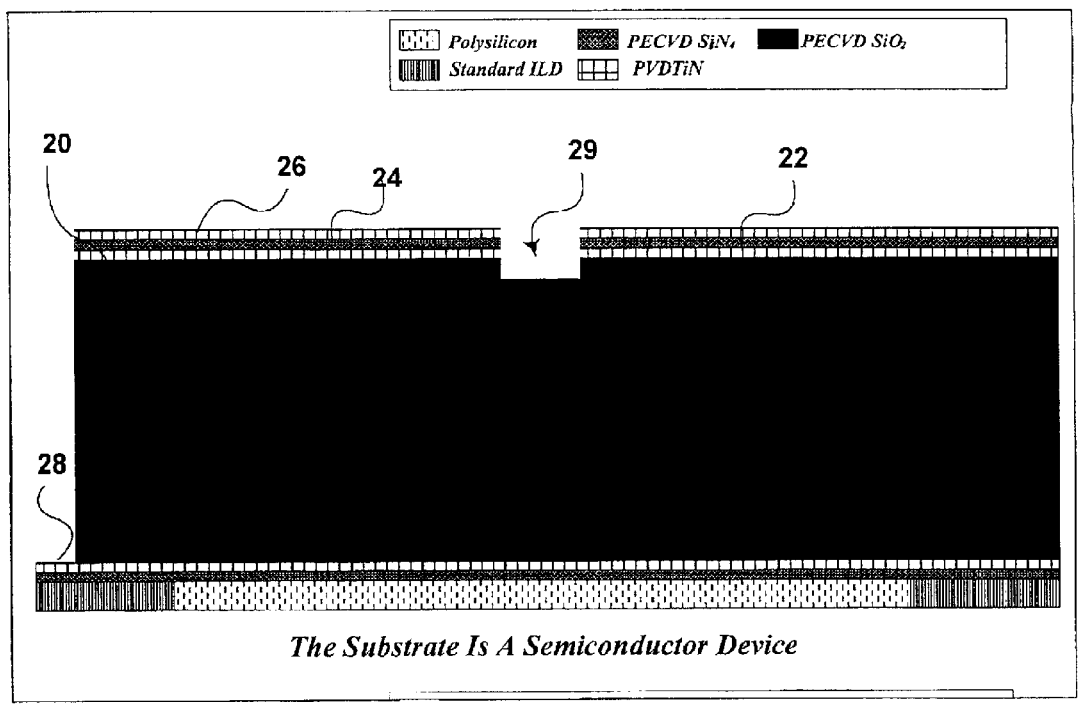
FIG. 3 illustrates step 8 of the micro-machining sequence.

In step 8, shown in FIG. 3, the second micro-machining mask is applied to define the Isotropic Wet Etching openings 29 followed by the Anisotropic RIE of the CRPVD TiN/PECVD $Si_3N_4$/CRPVD TiN sandwich and followed by the completion of the Anisotropic RIE of the PECVD $SiO_2$ outside the MEMS region as to reach the bottom 28 of CRPVD TiN layer. The degree of penetration of the opening 29 into the PECVD $SiO_2$ layer 20 of the future micro-channel is not critical.

Figure 4:
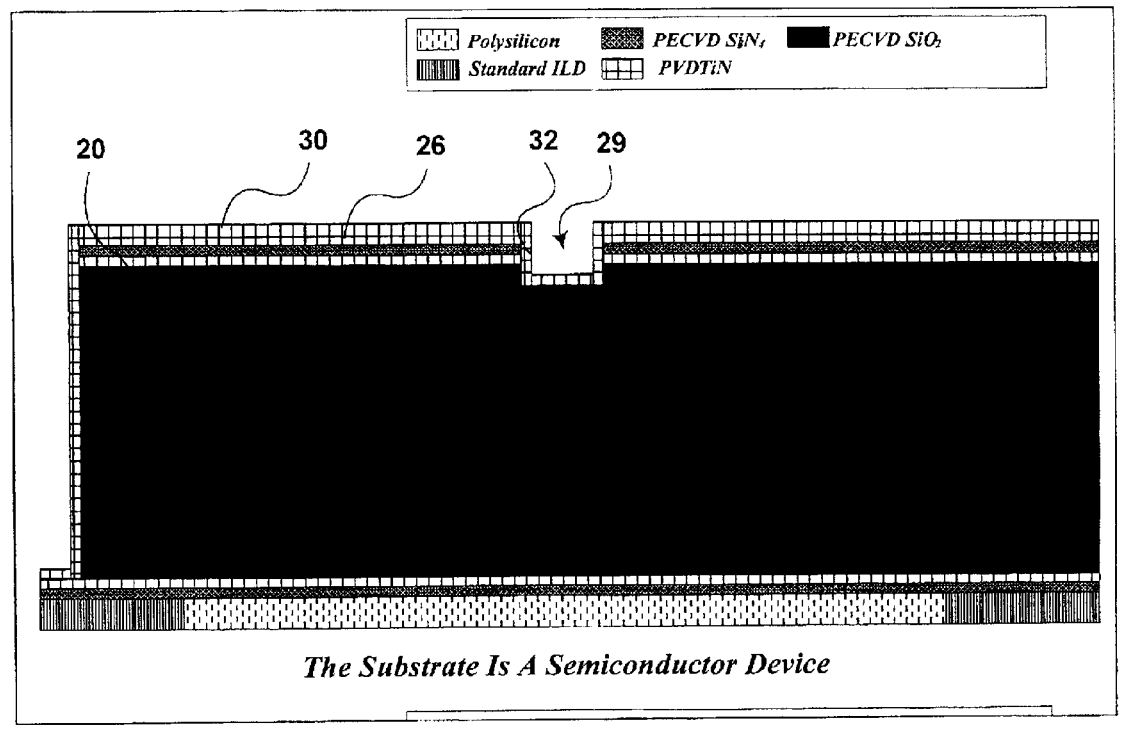
FIG. 4 illustrates step 9 of the micro-machining sequence.

In 9, shown in FIG. 4, a layer of CRPVD TiN 30 about 0.10 µm thick is deposited at 400° C.

Figure 5:
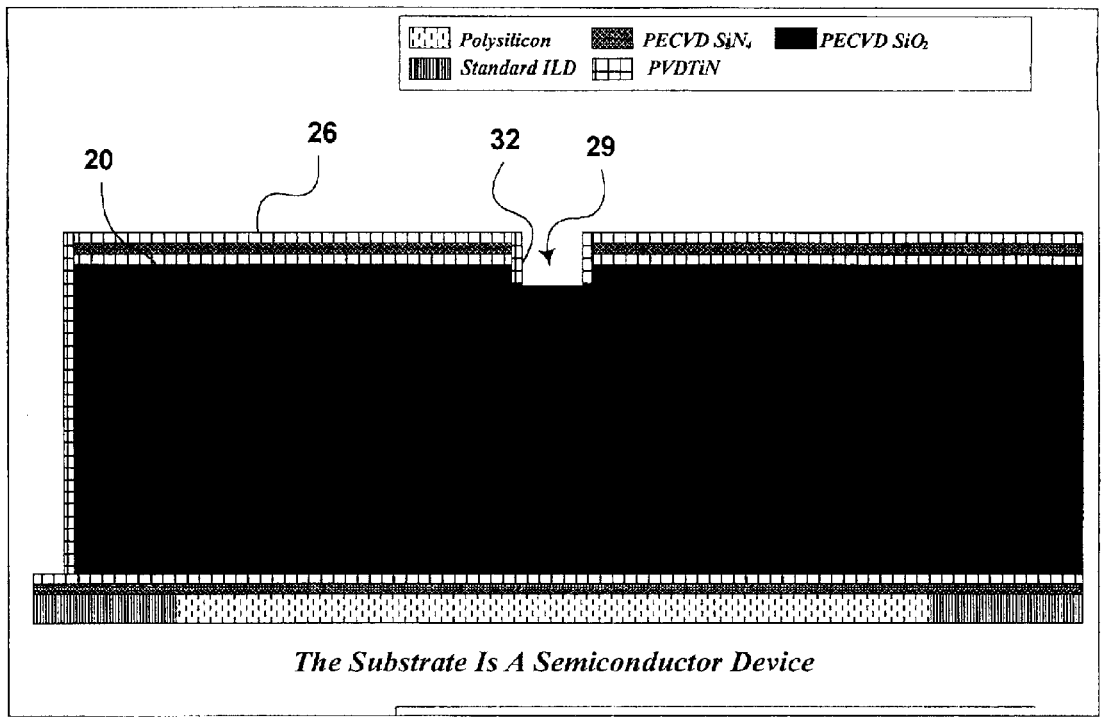
FIG. 5 illustrates step 10 of the micro-machining sequence.

In step 10, shown in FIG. 5, an anisotropic reactive ion etch (RIE) of the CRPVD TiN which provides CRPVD TiN spacers 32 on vertical side-walls is carried out to form the openings where an Isotropic Wet Etching will be performed.

Figure 6:
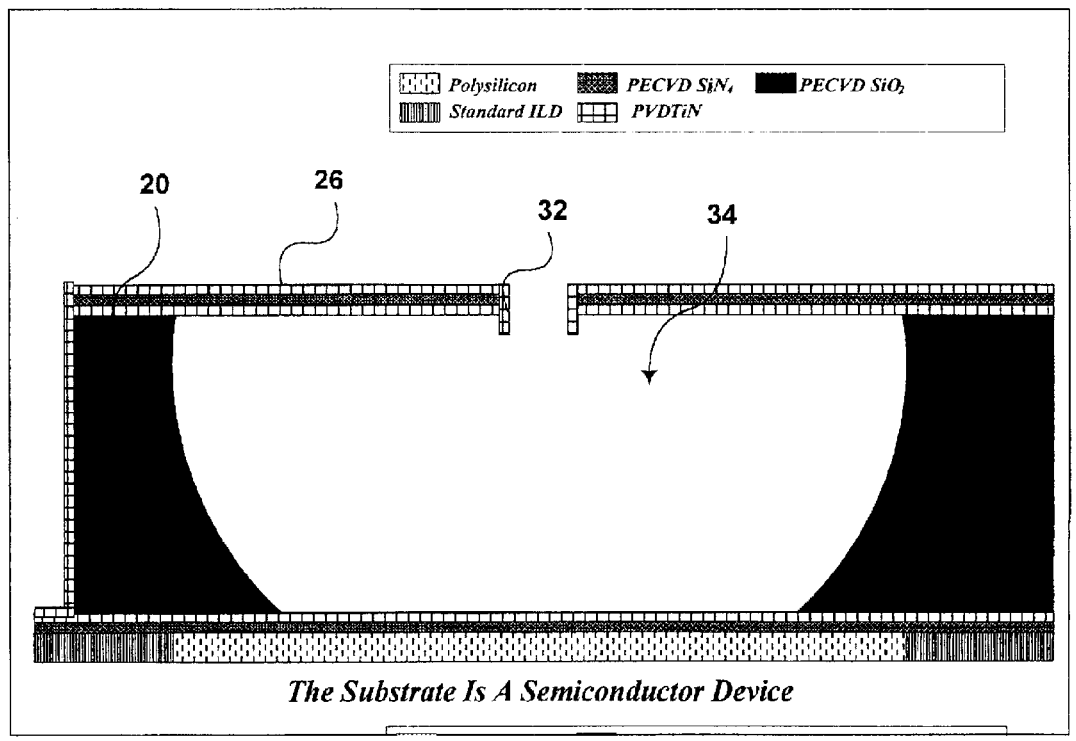
FIG. 6 illustrates step 11 of the micro-machining sequence.

In step 11, shown in FIG. 6, the isotropic wet etching of the PECVD $SiO_2$ layer 20 is carried out using either a mixture of Ethylene Glycol, $C_2H_4O_2H_2$, Ammonium Fluoride, $NH_4F$, and Acetic Acid, $CH_3COOH$, or alternately a mixture of Ammonium Fluoride, $NH_4F$, Hydrofluoric Acid, HF, and Water, $H_2O$, as to properly define the micro-channels. These two isotropic wet etchings are selective to CRPVD TiN which is used to protect the upper PECVD $Si_3N_4$ layer. Following the isotropic wet etching, the CRPVD TiN/PECVD $Si_3N_4$/CRPVD TiN sandwich is suspended over the micro-channels. The mechanical properties and relative thickness of the CRPVD TiN and PECVD $Si_3N_4$ layers are adjusted such that the structure is mechanically stable, i.e. does not bend-up or bend-down over the defined micro-channel, does not peel-off the edges of the underlying PECVD $SiO_2$, and does not break-down or collapse.

Figure 7:
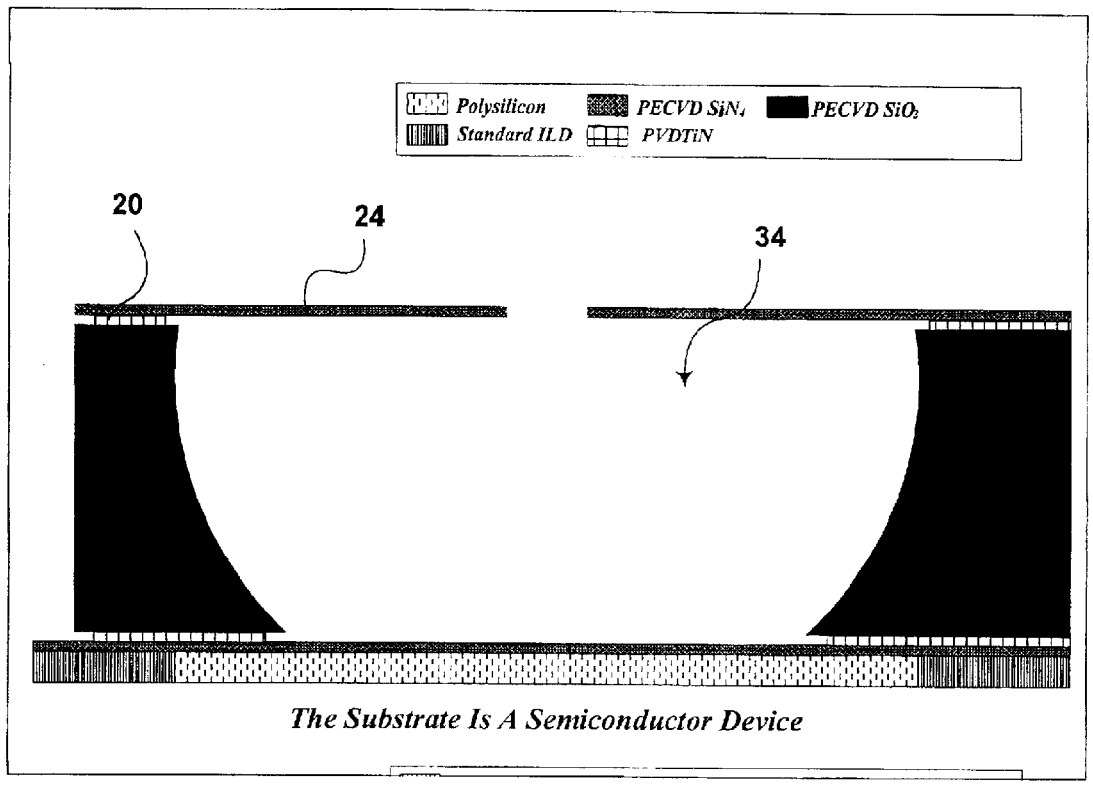
FIG. 7 illustrates step 12 of the micro-machining sequence.

In step 12, shown in FIG. 7, the isotropic wet removal of the CRPVD TiN is carried out using a mixture of Ammonium Hydroxide, $NH_4OH$, Hydrogen Peroxide, $H_2O_2$, and Water, $H_2O$. This Isotropic Wet Removal is selective to the PECVD $SiO_2$ and to the PECVD $Si_3N_4$. This step results in the formation of cavity 34 forming the micro-channel extending out of the plane of the drawing. Following the Isotropic Wet Etching, the PECVD $Si_3N_4$ layer is suspended over the micro-channels so its mechanical properties and thickness are adjusted such that the layer is mechanically stable, i.e. does not bend-up or bend-down over the defined micro-channel, does not peel-off the edges of the underlying PECVD $SiO_2$, does not break-down or collapse.

Figure 8:
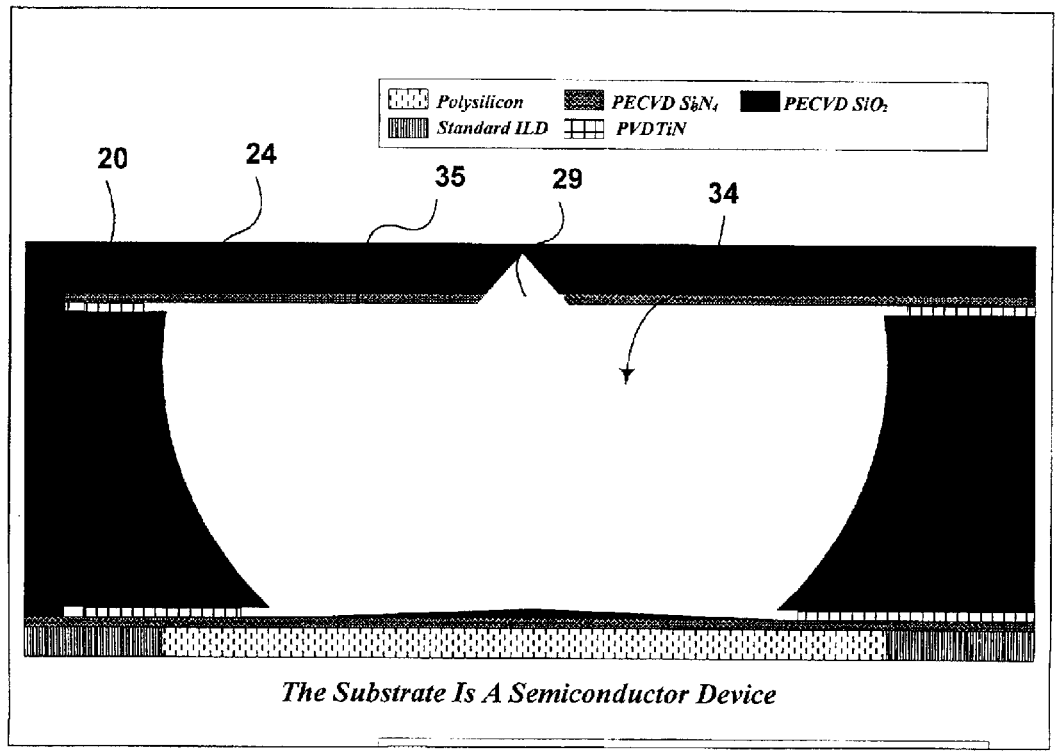
FIG. 8 illustrates step 13 of the micro-machining sequence.

In step 13, shown in FIG. 8, the closure of the opening 29 is carried out with the deposition of a layer 35 of PECVD $SiO_2$ about 1.40 μm thick at a temperature of 400° C. This is possible because the natural overhanging of PECVD $SiO_2$ on vertical surfaces allows a lateral growth of deposited material on these surfaces and ultimately, a closure of the openings. This closure of openings 29 with PECVD $SiO_2$ is important because it allows the formation of an enclosed micro-channel without the need of bonding two substrates and permits the fabrication of active micro-channels, in contrast to open micro-reservoirs. Some PECVD $SiO_2$ material is deposited at the bottom of the micro-channel over the electrode.

FIG. 9 shows a scanning electron micrograph, SEM, cross sectional views and top views demonstrating the closure of the micro-channels with PECVD $SiO_2$.

The pictures are for the SEM demonstration of the closure of the long-and-narrow openings over the micro-channels.

So far the approach is similar to that described in our co-pending application referred to above. In this co-pending application the openings 29 (FIG. 3) are in the form of long and narrow channels. The fabrication of micro-fluidics devices with micro-channels over existing CMOS and high-voltage CMOS (or BCD) devices can be improved replacing the long and narrow channels with a series of "dotted holes" extending along the path of the channels as described below. The holes are formed in the same manner as the channels with the aid of a suitable mask. This approach has the advantage of being much more flexible because the dotted holes can be used to generate a wide variety of enclosed micro-fluidics elements. As the holes have small diameters, they are easy to close, and the holes are close enough that after the wet isotropic etch (Step 11, FIG. 6), the etched cavities overlap to form one continuous channel extending under the path of the holes. The holes are closed in the same manner as the channels as described with reference to FIG. 8. The opening 29 illustrated in FIG. 3 can be thought of as one of a series of holes extending normal to the plane of the paper instead of a continuous channel as in the co-pending application.

Thus instead of forming one continuous long-and-narrow opening (Step 8, FIG. 3), a series of precisely positioned minimum size holes spaced by a maximum pre-determined distance are formed in the . The openings of these precisely positioned holes also allow the wet etching (Step 11, FIG. 6) of micro-channels because the pre-determined distance between the holes allows etch overlapping in the direction of the aligned holes.

The hole size of the series of aligned holes should be minimized, and preferably about 0.8 μm. The hole size can range between 0.3 μm and 5.0 μm. The smaller the size of hole, the easier the closure.

The maximum pre-determined distance between neighboring holes of a series of aligned holes to be used to define an underlying micro-channel should be minimized. It is preferably about 2.0 μm and can range between 0.8 μm and 10.0 μm. If the maximum distance between neighboring holes is kept smaller than a pre-determined value, which depends upon the thickness of PECVD $SiO_2$ (Step 3), the resulting micro-channels have smooth lateral walls with minimum ripples and are even easier to close with PECVD $SiO_2$ (Step 13, FIG. 8) than equivalent long-and-narrow openings.

The pre-determined distance between neighboring holes can be intentionally increased so as leave residual pillars between two wet-etched regions for use as mechanical filters, for example. In this case, the distance between neighboring holes has to be larger then the thickness of PECVD $SiO_2$ (step 3) to be wet-etched. The thickness of PECVD $SiO_2$ (step 3) to be wet-etched is preferably about 8.0 μm but can range between 1.0 and 100.0 μm.

The micro-channel achieved with the dotted-hole approach can be straight or can follow a curved line in the plane of the substrate. In that case, the dotted holes are positioned in a curved line as to allow the formation of the required curved micro-channel.

The "dotted holes" can be used to make "ball-rooms" from matrices of independent holes. The ball-rooms can be of odd shapes and can be of varying sizes including quite large sizes. In the case of a large size ball-room, the compressive or tensile mechanical stress of the top layer structure (CRPVD TiN/PECVD $Si_3N_4$/CRPVD) has to be minimum, preferably lower then 1000 Mpa, to prevent delamination or cracking of the structure during wet etching of the underlying PECVD $SiO_2$.

FIG. 10 shows a scanning electron micrograph, SEM, cross-section view of a micro-channel achieved with the dotted-hole approach. The picture is for SEM purposes only. In this case, the step 9 was not performed to protect against lateral etching of the opening.

FIG. 11 shows a scanning electron micrograph, SEM, view of a micro-channel achieved with dotted-holes. The cavity 34 can be clearly seen under the corresponding hole 40. The cavities associated with each hole overlap to form the micro-channel.

Figure 12:
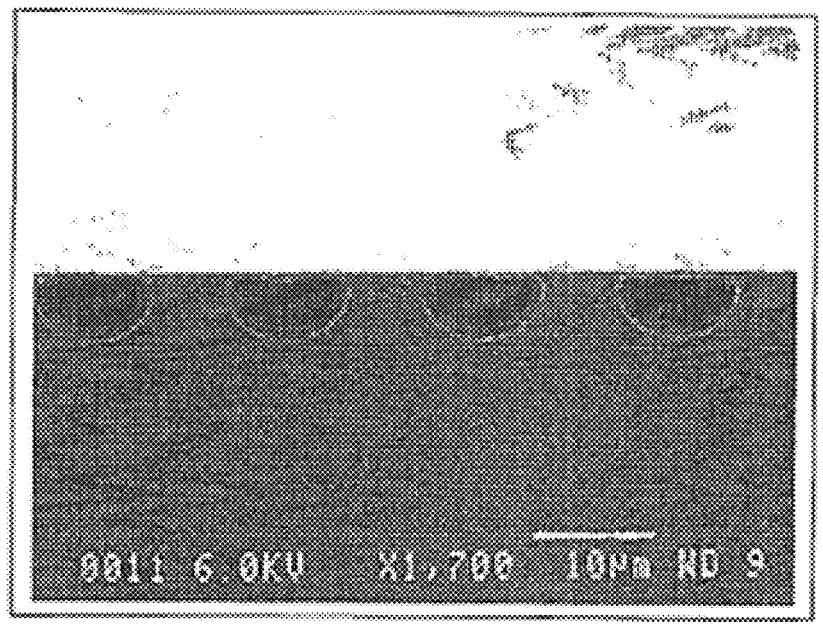
FIG. 12 shows a scanning electron micrograph, SEM, cross-section view of a series of independent micro-channels achieved with the dotted-hole approach.

FIG. 12 shows a scanning electron micrograph, SEM, cross-section view of a series of independent micro-channels achieved with the dotted-hole approach.

Figure 13:
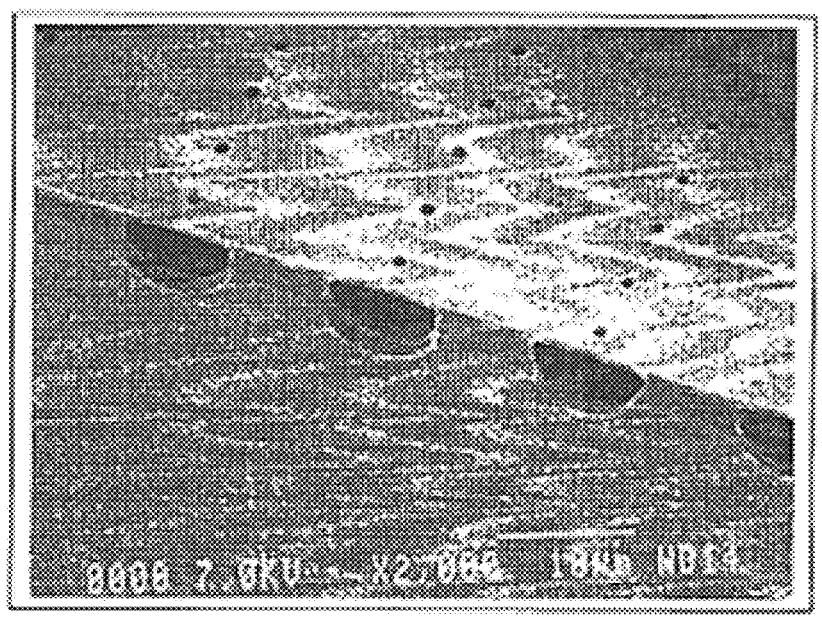
FIG. 13 shows a scanning electron micrograph, SEM, top view of a series of independent micro-channels achieved with the dotted-hole approach.

FIG. 13 shows a scanning electron micrograph, SEM, top view of a series of independent micro-channels achieved with the dotted-hole approach.

Figure 14:
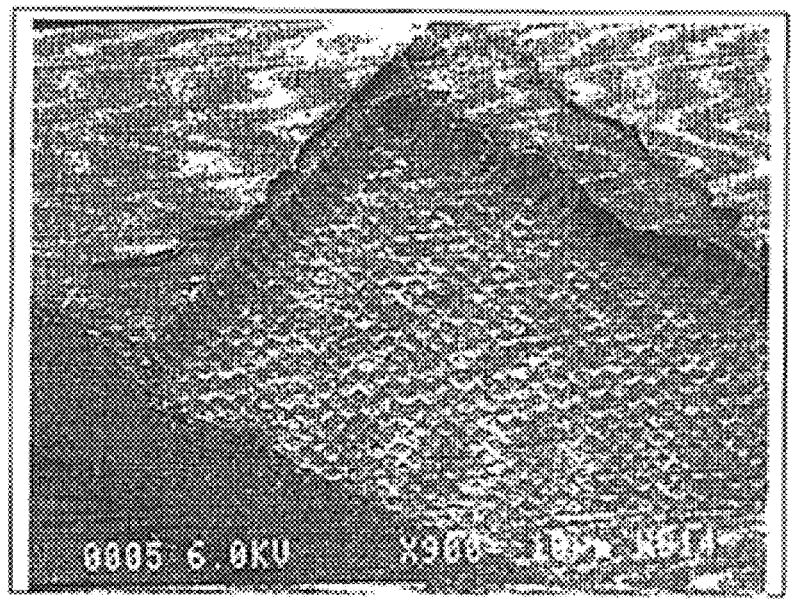
FIG. 14 shows a scanning electron micrograph, SEM, top view of a large size ball-room achieved from a matrix of independent holes (The top layer has been mechanically removed in order to observe the underlying features)

FIG. 14 shows a scanning electron micrograph, SEM, top view of a large size "ball-room" achieved from a matrix of independent holes. The top layer was mechanically removed in order to expose the underlying features.

It will be appreciated that the structures illustrated are made for the SEM purposes and do not represent actual devices.

Figure 15:
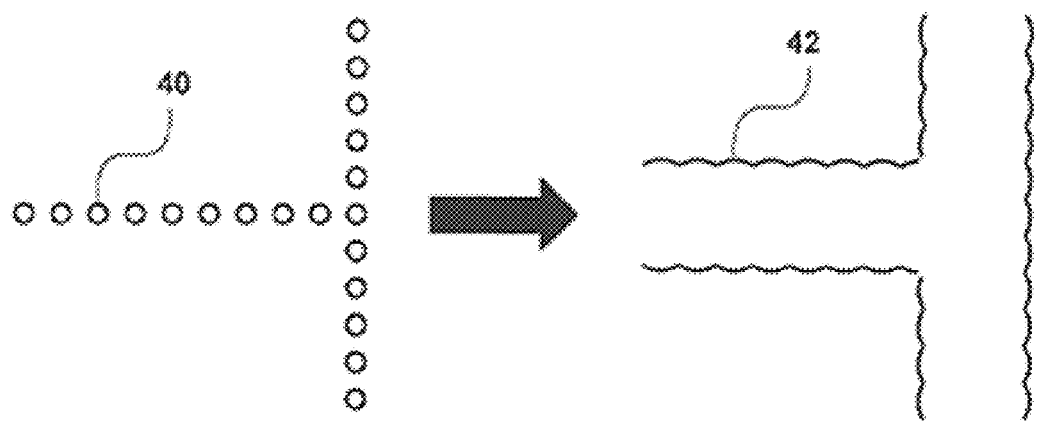
FIG. 15 is a top view of a Tee micro-channel using the dotted-holes approach.

FIG. 15 shows a dotted hole layout for the fabrication of a Tee micro-channel with the dotted-holes approach. The holes 40 are laid are formed in the workpiece shown in FIG. 8 in the form as a T. When the subsequent isotropic wet etch (FIG. 3) is carried out, the etched cavities overlap and form the T-shaped channel 42. This is closed off in the same way as the single cavity described with reference to FIG. 8.

Figure 16:
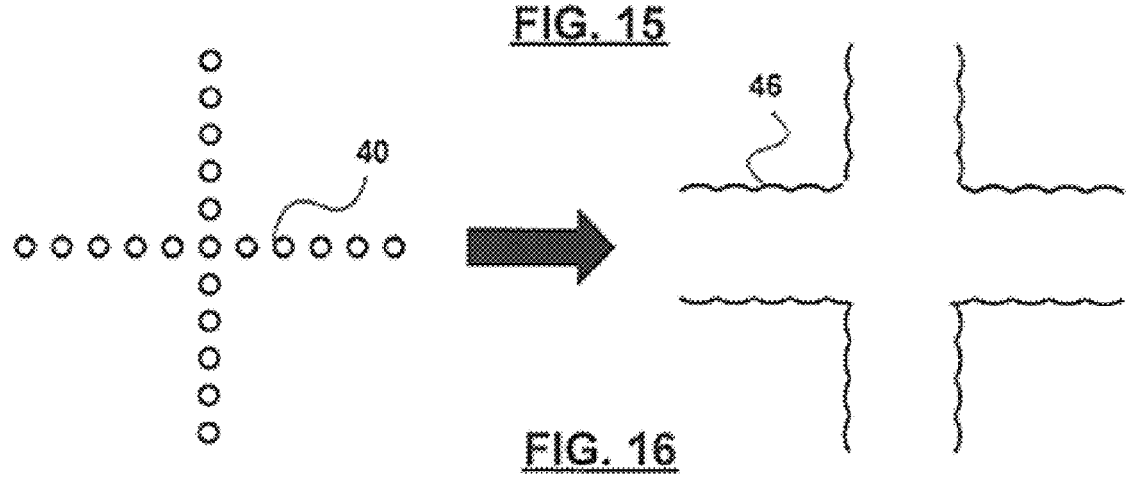
FIG. 16 is a top view of intersecting micro-channels using the dotted-holes approach.

FIG. 16 shows the formation of a channel intersection 46 with a cross arrangement of holes 40. The principle is the same as for FIG. 15. After the wet isotropic etch, the etch cavities overlap forming the micro-channels 46. These are then closed off in the same manner as described above.

Figure 17:
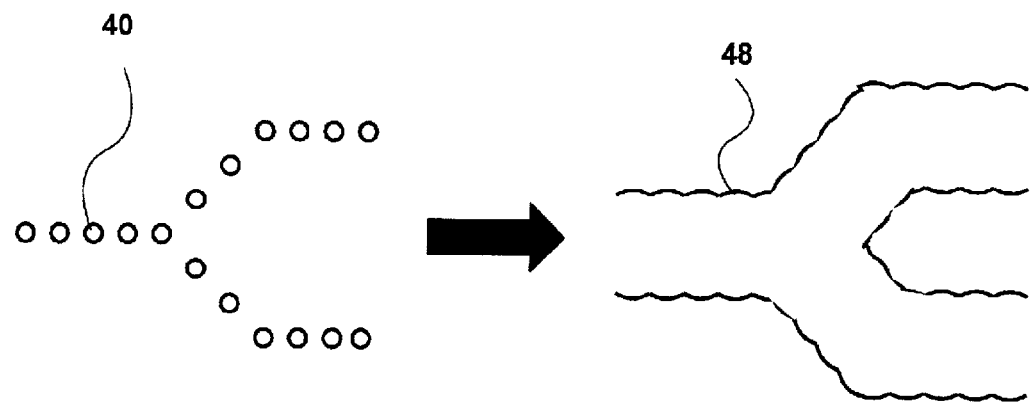
FIG. 17 is a top view of an angled micro-channel splitter using the dotted-holes approach.
Figure 18:
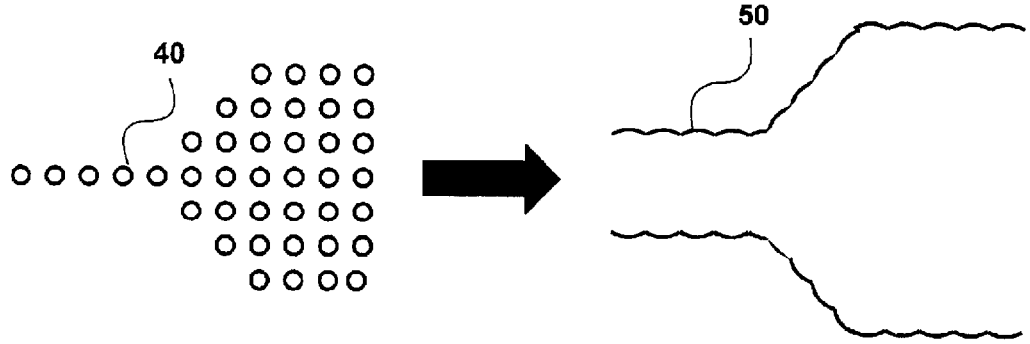
FIG. 18 is a top view of a diverging/converging micro-channel using the dotted-holes approach.
Figure 19:
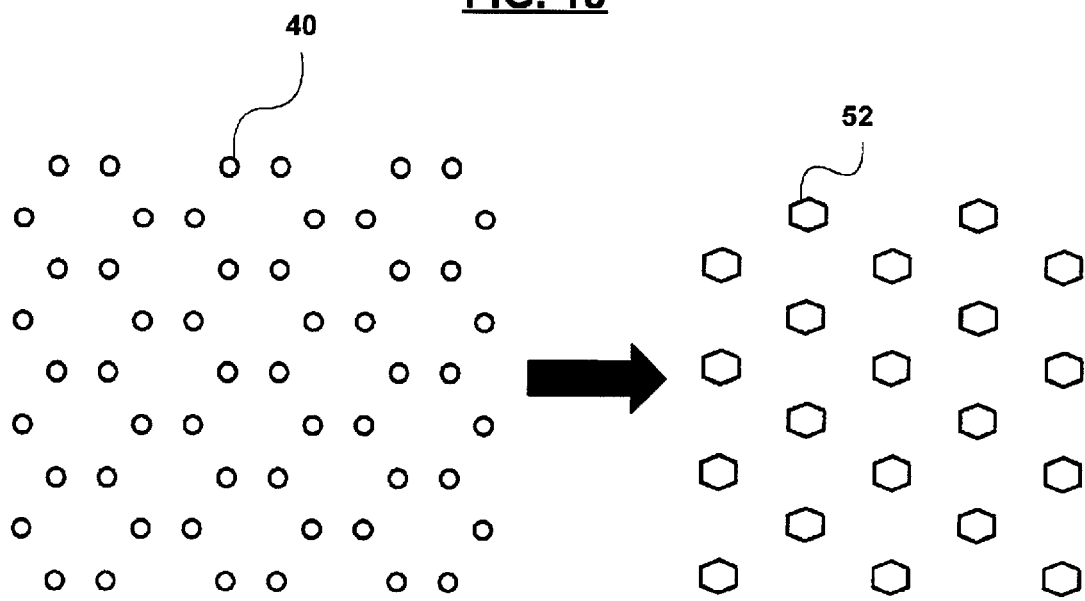
FIG. 19 is a top view example of a filter using the dotted-holes approach (The thinner the oxide, the smaller the distance between the holes and the finer the filter).

FIG. 17 illustrates the fabrication of an angled micro-channel splitter 48, FIG. 18 illustrates the fabrication of a diverging/converging micro-channel 50, and FIG. 19 illustrates the fabrication of a filter 52. In the latter case the holes 40 are distributed in a pattern that after etching results in a pattern of cavities 52 forming the filter.

Many variants of the above-described structures will be apparent to persons skilled in the art. The substrate could have no active device at all and be used as a passive substrate. Examples of suitable substrates are: Silicon, Quartz, Sapphire, Alumina, acrylonitrile-butadiene-styrene copolymer, polycarbonate, polydimethylsiloxane (PDMS), polyethylene, polymethylmethacrylate (PMMA), polymethylpentene, polypropylene, polystyrene, polysulfone, polytetrafluoroethylene (PTFE), polyurethane, polyvinylchloride (PVC), polyvinylidine fluoride (PVF).

The substrate could contain various types of low-voltage devices including: sensitive N-type MOS, sensitive P-Type MOS, high speed NPN Bipolar, high speed PNP Bipolar, Bipolar-NMOS, Bipolar-PMOS or any other semiconductor device capable of low signal detection and/or high speed operation.

The substrate could contain various types of high-voltage devices including: N-type Double Diffused Drain MOS, P-type Double Diffused Drain MOS, N-type Extended Drain MOS, P-type Extended Drain MOS, Bipolar NPN, Bipolar PNP, Bipolar-NMOS, Bipolar-PMOS, Bipolar-CMOS-DMOS (BCD), Trench MOS or any other semiconductor device capable of high voltage operation at voltages ranging from 10 to 2000 volts.

The substrate could have a compound semiconductor portion capable of on-chip opto-electronic functions such as laser emission and photo-detection. In that case, the substrate could be: Silicon with such on-chip opto-electronic functions, III–V compound semiconductor, II–VI compound semiconductor, II–IV compound semiconductor or combinations of II-III-IV-V semiconductors.

The lower polysilicon or Al-alloy capacitor electrode of Step 0 could be replaced by other electrically conductive layers, such as: Copper, Gold, Platinum, Rhodium, Tungsten, Molybdenum, Silicides or Polycides.

The lower $Si_3N_4$ layer defined at step 1 could be made thicker or thinner if the selectivity of the wet etching of Step 11 is poorer or better to prevent excessive etch of the electrode located under this $Si_3N_4$ layer or it could simply be eliminated if the fluid has to be in physical contact with the electrode located under this $Si_3N_4$ layer.

The sacrificial TiN layer defined at Step 2 could be made thicker, thinner or simply eliminated if the selectivity of the wet etching of step 11 is poorer, better or simply good enough to prevent excessive etch of the material located under this sacrificial TiN layer, or it could simply be eliminated if the fluid to be present inside the micro-channel has to be in physical contact with the electrode located under this TiN layer.

The $SiO_2$ material of the micro-channel defined at step 3 could be made thicker or thinner than 10.0 $\mu$m depending upon the required size of micro-channel.

The $SiO_2$ material of the micro-channel defined at step 3 could be replaced by a deposited thin/thick polymer film (using plasma-polymerization or other thin/thick polymer film deposition technique) such as: acrylonitrile-butadiene-styrene copolymer, polycarbonate, polydimethylsiloxane (PDMS), polyethylene, polymethylmethacrylate (PMMA), polymethylpentene, polypropylene, polystyrene, polysulfone, polytetrafluoroethylene (PTFE), polyurethane, polyvinylchloride (PVC), polyvinylidine fluoride (PVF). In this case a suitable isotropic wet etching selective to the other layers could be used to define the micro-channel into the thin/thick polymer film. The same thin/thick polymer film deposition technique could be used to ensure the closure of the openings over the micro-channels. Lower metallization temperatures would have to be used to prevent the thermal decomposition of the polymeric films.

The $SiO_2$ material of the micro-channel defined at step 3 could be replaced by a spun-on polyimide layer. In this case an isotropic wet etching selective to the other layers should be used to allow the formation of the micro-channel into the polyimide film;

The same thin/thick polymer film deposition technique could be used to ensure the closure of the openings over the micro-channels. Lower metallization temperatures should be used in this case to prevent the thermal decomposition of the polyimide film.

The $SiO_2$ material of the micro-channel defined at step 3 could be alloyed with different elements such as: Hydrogen, Boron, Carbon, Nitrogen, Fluorine, Aluminum, Phosphorus, Chlorine, or Arsenic.

The PECVD $SiO_2$ material of the micro-channel defined at step 3 could be deposited by technique other than PECVD, including: Low Pressure Chemical Vapor Deposition, LPCVD, Metal Organic Chemical Vapor Deposition, MOCVD, Electron Cyclotron Resonance Deposition, ECRD, Radio Frequency Sputtering Deposition, RFSD.

The sacrificial TiN layer defined at step 4 could be made thicker, thinner or simply eliminated if the selectivity of the wet etching of step 11 is poorer, better or simply good enough to prevent excessive etch of the material located over this sacrificial TiN layer.

The sacrificial TiN defined at step 4, step 6, and step 9 could be replaced by another sacrificial layer having: a) mechanical properties preventing warpage, delamination, cracking or other degradation of the suspended structured obtained at step 11 and b) excellent selectivity to Isotropic Wet Etching solutions used to define the micro-channels at step 11.

The sacrificial CRPVD TiN defined at step 4, step 6 and step 9 could be deposited by another technique, including: Metal Organic Chemical Vapor Deposition, MOCVD, Low Pressure Chemical Vapor Deposition, LPCVD, Plasma Enhanced Chemical Vapour Deposition, PECVD, Long Through Deposition, LTD, Hollow Cathode Deposition, HCD, and High Pressure Ionization Deposition, HPID.

The upper $Si_3N_4$ layer defined at Step 5 could be made thicker or thinner than 0.40 $\mu$m depending on its mechanical properties and on the mechanical properties of the surrounding materials as to prevent mechanical problems such as plastic deformation, peeling, cracking, de-lamination and other such problems at step 11.

The sacrificial TiN layer defined at step 6 could be made thicker, thinner or simply eliminated if the selectivity of the wet etching of step 11 is poorer, better or simply good enough to prevent excessive etch of the material located under this sacrificial TiN layer.

The partial Anisotropic RIE defined at step 7 could be eliminated if there is no need to define MEMS regions and non-MEMS regions in the device.

The deposition and partial RIE of the CRPVD TiN respectively defined at step 9 and step 10 providing CRPVD TiN 'spacers' on vertical side-walls of the openings could be eliminated if the selectivity of the wet etching of step 11 is such that there is no need for CRPVD TiN 'spacers' on vertical side-walls of the openings.

The sacrificial TiN layer defined at step 9 could be made thicker or thinner if the selectivity of the wet etching of step 11 is poorer or better to prevent excessive etch of the material located behind this sacrificial TiN layer.

The wet isotropic etching of PECVD $SiO_2$ defined at step 11 could be performed using other liquid mixtures than either: a) the $C_2H_4O_2H_2$, $NH_4F$, and $CH_3COOH$, or alternately b) $NH_4F$, HF, and $H_2O$, so as to properly define the micro-channels. Any other isotropic wet etchings of PECVD $SiO_2$ could be used if they are selective enough to the bottom layer of step 1 (or to the bottom electrode if no such bottom layer is used) and to the combination of layers becoming suspended during this isotropic wet etching.

The isotropic wet removal of the CRPVD TiN defined at step 12 could be eliminated if there is no use of sacrificial CRPVD TiN in the sequence.

The isotropic wet removal of the CRPVD TiN defined at step 12 could be performed using other liquid mixtures than $NH_4OH$, $H_2O_2$, and $H_2O$ if the isotropic wet removal is selective to the PECVD $SiO_2$ and to the other layers in contact with the isotropic wet removal.

The $SiO_2$ material of the micro-channel defined at step 13 could be made thicker or thinner than 1.40 μm depending upon the size of opening to be filled.

The $SiO_2$ material of the micro-channel defined at step 13 could be replaced by a deposited polymer film (using plasma-polymerization or other thin/thick polymer film deposition technique) such as: acrylonitrile-butadiene-styrene copolymer, polycarbonate, polydimethylsiloxane (PDMS), polyethylene, polymethylmethacrylate (PMMA), polymethylpentene, polypropylene, polystyrene, polysulfone, polytetrafluoroethylene (PTFE), polyurethane, polyvinylchloride (PVC), polyvinylidine fluoride (PVF).

The $SiO_2$ material of the micro-channel defined at step 13 could be alloyed with different elements such as: Hydrogen, Boron, Carbon, Nitrogen, Fluorine, Aluminum, Phosphorus, Chlorine, or Arsenic.

The PECVD $SiO_2$ material of the micro-channel defined at step 13 could be deposited by another technique then PECVD, including: Low Pressure Chemical Vapor Deposition, LPCVD, Metal Organic Chemical Vapor Deposition, MOCVD, Electron Cyclotron Resonance Deposition, ECRD, Radio Frequency Sputtering Deposition, RFSD and could incorporate the use of a filling technique such as Spin-On Glass, SOG, as to provide a smooth seamless upper surface.

The fluidics components to be machined using the dotted-holes approach can be applied without limitation to Tee micro-channels; intersecting micro-channels; splitting micro-channels; converging micro-channels; diverging micro-channels; variable Width micro-channels; filters; and can also be used for microdetection/analysis/reactors; micro-opto-fluidics systems; micro-fluid delivery systems; micro-fluid interconnect systems; micro-fluid transport system; micro-fluid mixing systems; micro-valves/pumps systems; micro flow/pressure systems; micro-fluid control systems; micro-heating/cooling systems; micro-fluidic packaging; micro-inkjet printing; laboratory-on-a-chip, LOAC, devices; MEMS requiring enclosed micro-channels; and MEMS requiring micro-channels.

An important advantage of the new dotted-holes approach described is its flexibility.

We claim:

1. A method of fabricating a microstructure for micro-fluidics applications, comprising the steps of:

forming a layer of etchable material on a substrate;

forming a mechanically stable support layer over said etchable material;

performing an anisotropic etch through a mask to form a pattern of holes extending through said support layer to said etchable material and lving along a projected oath of a continuous micro-channel to be formed within said etchable material, performing an isotropic etch through each said hole to form a corresponding cavity in said etchable material under each said hole, said corresponding cavity extending under said support layer to communicate with an adjacent said cavity whereby a series of said communicating cavities form said micro-channel; and forming a further layer of depositable material over said support layer until overhanging portions of said depositable layer meet to close each said hole.

2. A method as claimed in claim 1, wherein the distance between neighboring holes lies in the range 0.8 μm to 10.0 μm.

3. A method as claimed in claim 1, wherein the distance between neighboring holes is about 2.0 μm.

4. A method as claimed in claim 1, wherein said pattern is T-shaped and said isotropic etch results in a T-shaped micro-channel.

5. A method as claimed in claim 1, wherein said pattern is cross-shaped and said isotropic etch results in intersecting micro-channels.

6. A method as claimed in claim 1, wherein said pattern is V-shaped and said isotropic etch results in micro-channel splitter.

7. A method as claimed in claim 1, wherein said pattern of holes is in the form of an array with a narrow portion and a wide portion, and said isotropic etch results in micro-channel that widens out from a narrow portion to a wide portion.

8. A method as claimed in claim 1, wherein the hole size lies in the range 0.3 μm to 5.0 μm.

9. A method as claimed in claim 8, wherein the hole size is about 0.8 μm.

10. A method as claimed in claim 1, wherein a sacrificial layer is deposited on top of said support layer prior to performing said anisotropic etch.

11. A method as claimed in claim 10, wherein each said sacrificial layer is removed by etching at least in the vicinity of the micro-channel after formation of said micro-channel.

12. A method as claimed in claim 1, wherein said layer of etchable material is deposited onto a substrate containing an active device.

13. A method as claimed in claim 12, wherein said active device is a CMOS device.

14. A method as claimed in claim 1, wherein said layer of etchable material is $SiO_2$.

15. A method as claimed in claim 14, wherein said layer of etchable material is deposited by PECVD.

16. A method as claimed in claim 14, wherein said support layer is made of $Si_3N_4$.

17. A method as claimed in claim 16, wherein a sacrificial layer is deposited under said support layer prior to deposition of said support layer.

18. A method as claimed in claim 16, wherein said depositable material is $SiO_2$, and said support layer is $Si_3N_4$.

19. A method of fabricating a microstructure for microfluidics applications, comprising the steps of:
forming a layer of etchable material on a substrate;
forming a first sacrificial layer on said etchable material;
forming a mechanically stable support layer on said first sacrificial layer;
forming a second sacrificial layer on said support layer;
providing a mask;
performing an anisotropic etch through said mask to form a pattern of holes extending through said support layer into said etchable material, said holes being separated from each other by a predetermined distance;
performing an isotropic etch through each said hole to form a corresponding cavity in said etchable material under each said hole and extending under said support layer;
removing each of said first and second sacrificial layers to expose said support layer; and
forming a further layer of depositable material over said support layer until portions of said depositable layer overhanging each said hole meet and thereby close the cavity formed under each said hole.

20. A method as claimed in claim 19, wherein said holes are arranged in a pattern along the path of a projected micro-channel and said cavities overlap to form said microchannel.

21. A method as claimed in claim 19, wherein said predetermined distance is selected such that said cavities do not overlap in order to leave pillars therebetween.

22. A method as claimed in claim 19, wherein said further layer of depositable material is $SiO_2$.

23. A method as claimed in claim 22, wherein said further layer is deposited by PECVD.

24. A method as claimed in claim 19, wherein a further sacrificial layer is deposited after forming said holes and prior performing said isotropic etch to form sidewall spacers for said holes.

25. A Method as claimed in claim 24, wherein said sacrificial layers are TiN.

26. A method as claimed in claim 25, wherein said TiN is deposited by CRPVD.

27. A method of fabricating a microstructure for microfluidics applications, comprising the steps of:
forming a layer of etchable material on a substrate;
forming a mechanically stable support layer over said layer of etchable material;
forming a sacrificial layer over said support layer to protect said support layer during a subsequent isotropic etch;
forming a pattern of holes in said mechanically stable support layer;
performing said isotropic etch through each said hole to form a corresponding cavity in said etchable material under each said hole and extending under said support layer;
removing said sacrificial layer at least in the vicinity of said holes; and
forming a further layer of depositable material over said support layer until portions of said depositable layer overhanging each said hole meet and thereby close the cavity formed under each said hole.

28. A method as claimed in claim 27, wherein said pattern of holes is arranged along a projected path of a microchannel and said cavities overlap to form said microchannel.

29. A method as claimed in claim 28, wherein said further layer of depositable material is $SiO_2$ deposited by PECVD.

* * * * *